US009667230B1

(12) United States Patent
Fojtik et al.

(10) Patent No.: US 9,667,230 B1
(45) Date of Patent: May 30, 2017

(54) LATCH AND FLIP-FLOP CIRCUITS WITH SHARED CLOCK-ENABLED SUPPLY NODES

(71) Applicant: NVIDIA Corporation, Santa Clara, CA (US)

(72) Inventors: Matthew Rudolph Fojtik, Raleigh, NC (US); Ilyas Elkin, Sunnyvale, CA (US); Yanqing Zhang, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 15/078,956

(22) Filed: Mar. 23, 2016

(51) Int. Cl.
*H03K 3/356* (2006.01)
*H03K 3/012* (2006.01)

(52) U.S. Cl.
CPC ....... *H03K 3/012* (2013.01); *H03K 3/356113* (2013.01)

(58) Field of Classification Search
CPC .. H03K 3/012; H03K 3/037; H03K 3/356104; H03K 3/0372; H03K 3/0375
USPC ........ 327/211, 202, 208, 210, 199–201, 203, 327/212, 214, 215, 218–220, 223
See application file for complete search history.

(56) References Cited

U.S. PATENT DOCUMENTS

2013/0021078 A1* 1/2013 Elkin ............... H03K 3/356191 327/218
2015/0028927 A1* 1/2015 Elkin ............... H03K 3/0372 327/203

* cited by examiner

*Primary Examiner* — Lincoln Donovan
*Assistant Examiner* — Thomas Skibinski
(74) *Attorney, Agent, or Firm* — Zilka-Kotab, PC

(57) ABSTRACT

A method for operating a latch and a latch circuit are disclosed. The latch circuit comprises a storage sub-circuit, a propagation sub-circuit, and a shared clock-enabled transistor. The storage sub-circuit is configured to capture a level of an input signal when a clock signal transitions from first level to a second level and hold the captured level to generate an output signal while the clock signal is at the second level. The propagation sub-circuit is configured to enable a path through a blocking transistor to the shared clock-enabled supply node to propagate the captured level of the input signal to the storage sub-circuit. The shared clock-enabled transistor is configured to couple the shared clock-enabled supply node to a power supply while the clock signal is at the first level and decouple the shared clock-enabled supply node from the power supply while the clock signal is at the second level.

20 Claims, 14 Drawing Sheets

LATCH AND FLIP-FLOP CIRCUITS WITH SHARED CLOCK-ENABLED SUPPLY NODES

FIELD OF THE INVENTION

The present invention generally relates to digital latch circuits and more specifically to a low-clock-energy latch circuit.

BACKGROUND

Power dissipation is a significant problem in conventional integrated circuits. In many applications, the performance of integrated circuit devices is limited by the amount of energy consumed by the circuitry implementing a function rather than by the die area of the circuitry. A large fraction of the power dissipated in conventional digital integrated circuits is consumed in the clock network. The amount of energy that is consumed by flip-flops due to data transitions is small because the activity factor, the fraction of time the data input of the flip-flop toggles, is quite low, typically about 5-10%. In contrast, the clock input load and clock energy is a particularly important metric for determining the energy that is consumed by the latches and flip-flops. Hence reducing the clock-switched capacitance by a given amount may produce a greater power savings compared with reducing the data-switched capacitance by the same amount.

Accordingly, what is needed in the art is a latch circuit that reduces the clock energy by reducing the capacitance of clock loads. Thus, there is a need for addressing these issues and/or other issues associated with the prior art.

SUMMARY

A method for operating a latch and a latch circuit are disclosed. The latch circuit comprises a storage sub-circuit, a propagation sub-circuit, and a shared clock-enabled transistor. The storage sub-circuit is configured to capture a level of an input signal when a clock signal transitions from first level to a second level and hold the captured level to generate an output signal while the clock signal is at the second level. The propagation sub-circuit is configured to enable a path through a blocking transistor to the shared clock-enabled supply node to propagate the captured level of the input signal to the storage sub-circuit. The shared clock-enabled transistor is configured to couple the shared clock-enabled supply node to a power supply while the clock signal is at the first level and decouple the shared clock-enabled supply node from the power supply while the clock signal is at the second level.

DETAILED DESCRIPTION

Figure 1:
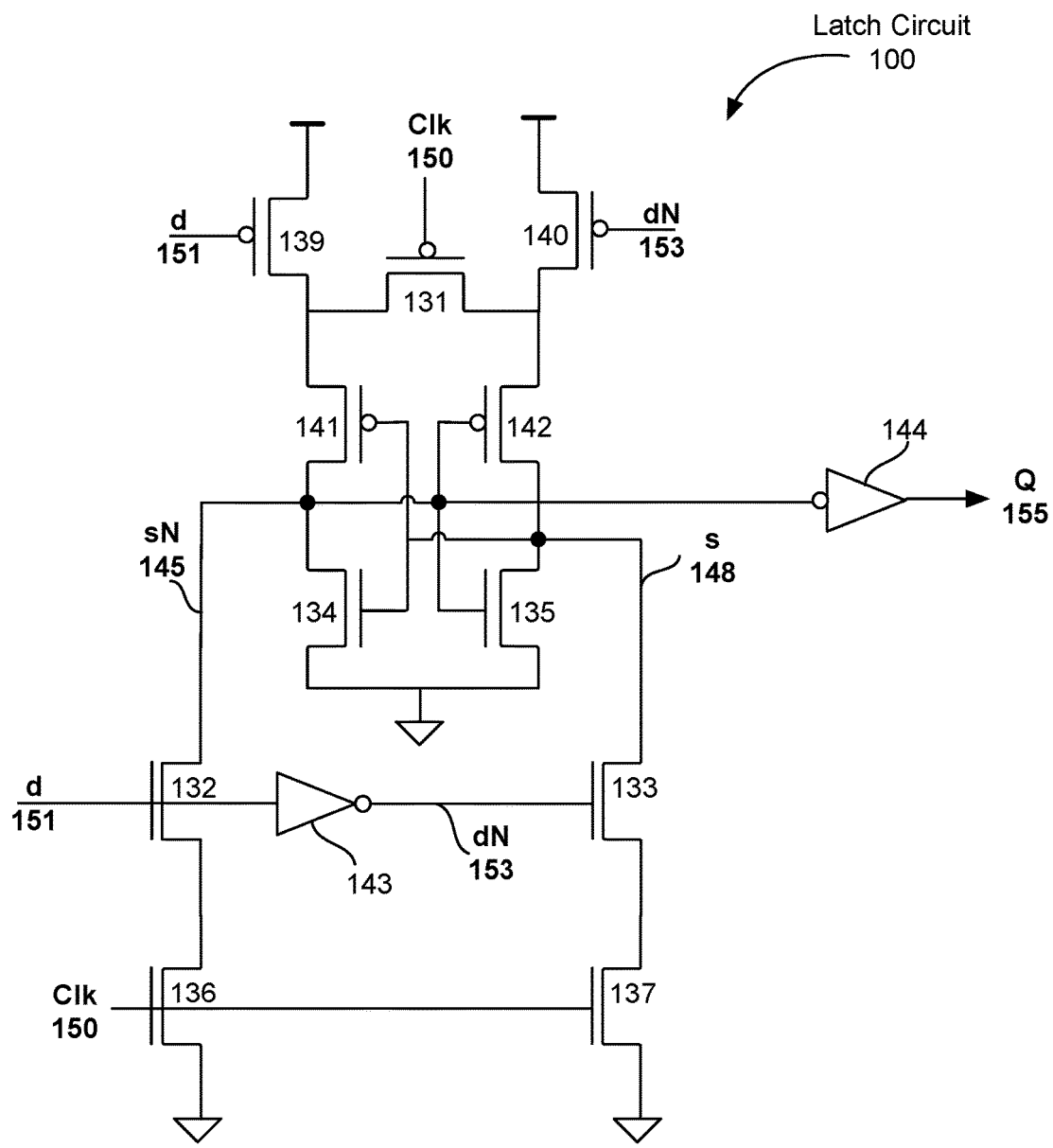
FIG. 1 illustrates a latch circuit, in accordance with the prior art.

FIG. 1 illustrates a low-clock-energy latch circuit 100 that is transparent when the clock signal, Clk 150 is high, in accordance with the prior art. The latch circuit 100 is a fully-static, energy-efficient latch that presents only three loads to the clock. The total number of transistors included in the latch circuit 100 is fifteen, where each of inverters 143 and 144 include two transistors.

As shown in FIG. 1 transistors 132, 133, 134, 135, 136, and 137 are NMOS devices and transistors 131, 139, 140, 141, and 142 are PMOS devices. Transistors 134, 141, 135, and 142 are configured as cross-coupled inverters that are enabled by pull-up transistors 139 and 140 to form a storage sub-circuit. A first inverter includes transistors 141 and 134 and a second inverter includes transistors 142 and 135. The transistor 131 is an enabled bridging transistor that is configured to enable the storage sub-circuit when clock signal, Clk 150, is low by allowing current to flow from the supply voltage through either transistor 139 or 140 when Clk 150 is low. The bridging transistor 131 is configured to enable a path between the storage sub-circuit and the supply voltage. Importantly, the connection to the supply voltage is provided by either transistor 139 or 140 because one (and only one) of transistors 139 and 140 is enabled at a time. The transistor 131 is shared between both inverters of the storage sub-circuit. Transistors 132, 133, 136, 137, 139, 140, and inverter 143 that generates dN 153 form propagation circuitry that passes the input signal d 151 to the output signal Q 155. The inverter 144 isolates Q 155 from the storage feedback loop of the storage sub-circuit.

When the Clk 150 is high either transistors 132 and 140 are enabled or transistors 139 and 133 are enabled to drive the complement of input signal d 151 onto storage node sN 145 or to drive the input signal d 151 onto storage node s 148, respectively. Importantly, when the Clk 150 is high the enabled bridging transistor 131 is disabled and only one of the inverters formed by transistors 141 and 134 or transistors 142 and 135 has a pull-up path enabled. Consequently, the transistors driving the storage nodes sN 145 and s 148 do not need to overpower an opposing pull-up device and the storage nodes sN 145 and s 148 are easily written.

While the Clk 150 is high, the output signal Q 155 will follow the level of input signal d 151. When the Clk 150 falls, the storage sub-circuit captures the level of input signal d 151 and holds the level to generate the output signal Q 155 while the Clk 150 is low. When the clock 150 is low, diffusions on transistors 141 and 142 are connected together and to the power supply through either transistor 151 or 153. A cross-coupled inverter is formed by transistors 134, 141, 135 and 142 that holds the values on s 148 and sN 145.

Latch and Flip-Flop Circuits with Shared Clock-Enabled Supply Nodes

While the latch circuit 100 includes only three clock-enabled transistors, a latch circuit may be configured to use only two clock-enabled transistors, as described further herein. Additionally, the two clock-enabled transistors may be shared between two or more latch circuits to create multi-bit latch circuits, flip-flop circuits, and/or multi-bit flip-flop circuits. When two or more latch circuits are combined to share the two clock-enabled transistors, the number of clock-enabled transistors per latch circuit is reduced to less than or equal to one. However, because the clock-enabled transistors 131, 136 and 137 of the latch circuit 100 are integrated into the functionality of the circuit, the clock-enabled transistors cannot be simply shared with another latch circuit 100. Therefore, the number of clock-enabled transistors per latch circuit 100 cannot be reduced below three.

In one embodiment, a latch circuit comprising only two clock-enabled transistors comprises a storage sub-circuit, a propagation sub-circuit, and a shared clock-enabled transistor. The storage sub-circuit is configured to capture a level of an input signal when a clock signal transitions from high to a low and hold the level to generate an output signal while the clock signal is low. The propagation sub-circuit is configured to enable a path through a blocking transistor to a shared clock-enabled supply node to propagate the level of the input signal to the storage sub-circuit. The shared clock-enabled transistor is configured to couple the shared clock-enabled supply node to a power supply while the clock signal is high and decouple the shared clock-enabled supply node from the power supply while the clock signal is low.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2A:
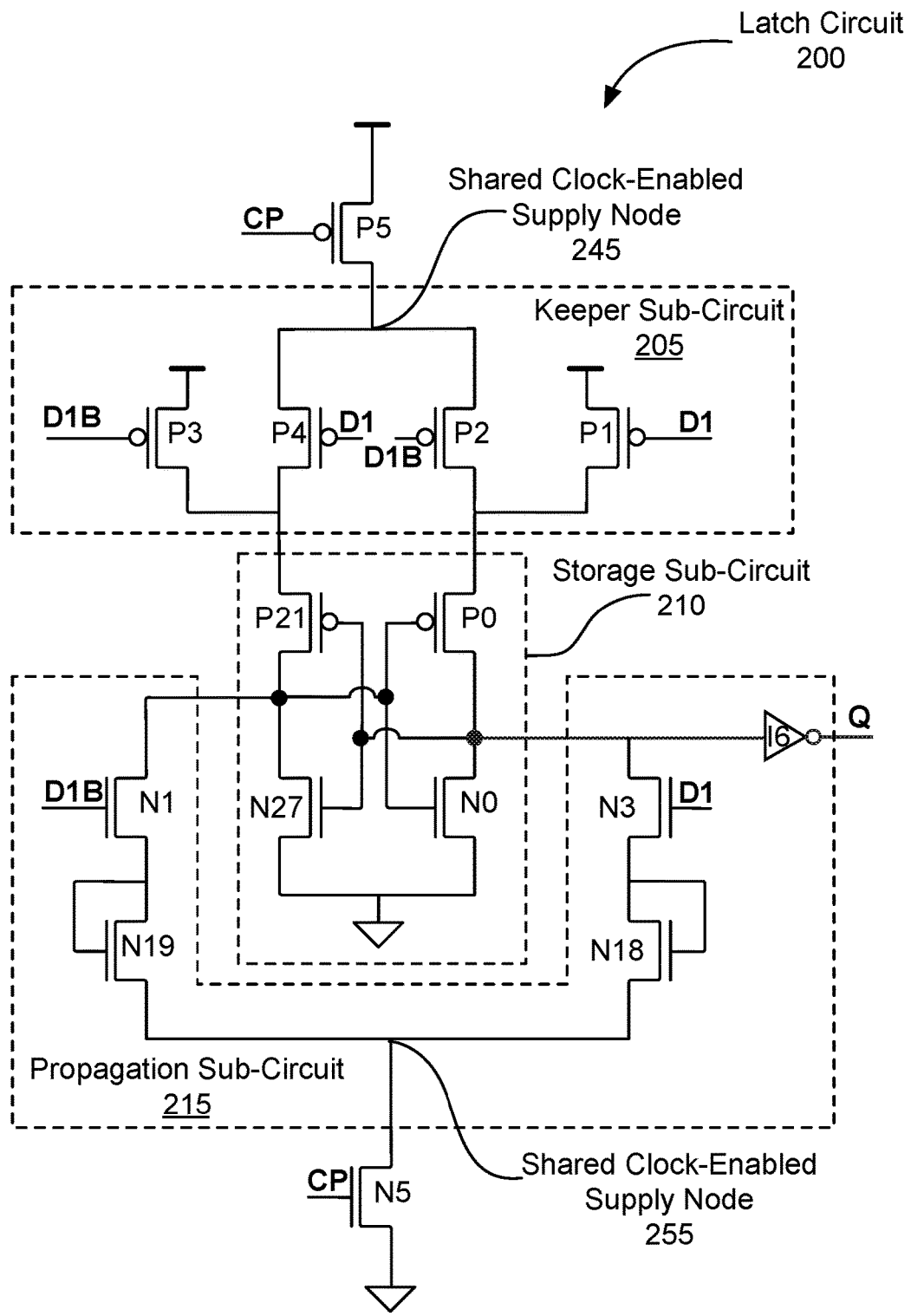
FIG. 2A illustrates a low clock power positive latch circuit, in accordance with one embodiment.

FIG. 2A illustrates a low clock power positive latch circuit 200, in accordance with one embodiment. As shown in FIG. 2A transistors N0, N1, N3, N5, N18, N19, and N27 are NMOS devices and transistors P0, P1, P2, P3, P4, P5, and P21 are PMOS devices. The latch circuit 200 includes only two clock-enabled transistors, shared clock-enabled transistor P5 and shared clock-enabled transistor N5. The clock-enabled transistor P5 is coupled between a high power supply (e.g., VDD) and a shared clock-enabled supply node 245 within a keeper sub-circuit 205. The clock-enabled transistor N5 is coupled between a low power supply (e.g., ground) and a shared clock-enabled supply node 255 within a propagation sub-circuit 215. A storage sub-circuit 210 is coupled between the keeper sub-circuit 205 and the propagation sub-circuit 215.

When the clock signal CP is high, the latch circuit 200 is transparent so that a voltage level of an input signal D1 propagates to an output signal Q. An input signal D1B is an inverted version of the input signal D1. When the clock signal CP transitions from high to low the level of the input signal D1 is captured and stored in the storage sub-circuit 210. When the clock signal CP is low, the output signal Q is held at the captured level. An output buffer 16 generates the output signal Q and prevents variations in a load at Q from changing the voltage level stored in the storage sub-circuit 210.

The storage sub-circuit 210 includes two cross-coupled inverters configured to capture and store the level of the input signal D1. A first inverter is formed by the transistors P0 and N0 and a second inverter is formed by the transistors P21 and N27. A voltage level of the input D1 and D1B is stored into the storage sub-circuit 210 when the propagation sub-circuit 215 drives a low power supply voltage onto an input of one of the two cross-coupled inverters within the storage sub-circuit 210 while the transistor N5 is enabled (e.g., when CP is high).

When CP is low, the transistor N5 is disabled and the low power supply voltage path to write the storage sub-circuit 210 is disabled. The high power supply voltage paths to both of the cross-coupled inverters within the storage sub-circuit 210 are enabled. For example, when the input D1 is low, D1B is high, and the transistors P1 and P4 are both enabled. When the input D1 is high, D1B is low, and the transistors P3 and P2 are both enabled. The clock-enabled transistor P5 provides a path from the shared clock-enabled supply node 245 to the high power supply voltage when CP is low.

In contrast, the storage sub-circuit 210 is coupled to a high power supply voltage by only one of transistors P3 or P1. When CP is high the storage sub-circuit 210 may be written and the latch circuit 200 is transparent (i.e., the voltage level of input D1 is propagated to the output Q). When the input D1 equals Q, the storage sub-circuit 210 is not written. For example, when D1 and Q are both low, the transistor N3 is disabled and the transistors N1 and P1 are enabled, so that the gates of transistors P0 and N0 are pulled low. The transistor P0 is enabled to drive the input of the inverter 16 high and the inverter 16 maintains the Q output at a low voltage level. Although the gates of transistors P0 and N0 are connected to the drain of the clock-enabled transistor P5 via P21 and P4, transistor P21 is off and the storage sub-circuit 210 is not being written, so there is no fight between the cross-coupled inverters.

When D1 and Q are both high, the transistor N1 is disabled and the transistors N3 and P3 are enabled, so that the gates of transistors P21 and N27 are pulled low. The transistor P21 is enabled to drive the gates of transistors P0 and N0 high. The transistor N0 pulls the input of the inverter 16 low and the inverter 16 maintains Q at a high voltage level. Although the gates of transistors P21 and N27 are connected to the drain of the clock-enabled transistor P5 via P0 and P2, transistor P0 is off and the storage sub-circuit 210 is not being written, so there is no fight between the cross-coupled inverters.

When CP is high and the storage sub-circuit 210 is written, the voltage level of the output Q transitions to equal the input D1. When the input D1 transitions to a high level while the output Q is low, the transistor P3 is enabled, the transistors N1 and P1 are disabled, and the transistor N3 is enabled, so that the gates of transistors P21 and N27 are pulled low. The transistor P3 provides a path between the transistor P21 and the high power supply. The transistor P21 is enabled to pull the gates of transistors P0 and N0 high. N0 is enabled to drive the input of the inverter 16 low and the inverter 16 transitions the Q output to a high voltage level. The transistor P1 is off and although the transistor P2 is enabled, the clock-enabled transistor P5 is off, thereby a connection to the high power supply is prevented and a fight between the cross-coupled inverters is avoided.

When the input D1 transitions to a low level while the output Q is high, the transistor P1 is enabled, the transistors N3 and P3 are disabled, and the transistor N1 is enabled, so that the gates of transistors P0 and N0 are pulled low. The transistor P1 provides a path between the transistor P0 and the high power supply. The transistor P0 is enabled to drive the input of the inverter 16 high and the inverter 16 transitions the Q output to a low voltage level. The transistor P3 is off and although the transistor P4 is enabled, the clock-enabled transistor P5 is off, thereby a connection to the high power supply is prevented and a fight between the cross-coupled inverters is avoided.

Because the shared clock-enabled supply node 245 is not driven high when the transistor P5 is off and the shared clock-enabled supply node 255 is not driven low when the transistor N5 is off, the latch circuit 200 operates correctly. Importantly, when two or more latch circuits 200 are coupled in parallel, sharing a single clock-enabled transistor N5 to form a multi-bit latch, blocking transistors N19 and N18 prevent one latch circuit 200 from driving the shared clock-enabled supply node 255 low when the clock CP is low. A drain terminal of a first blocking transistor N19 is directly coupled to a gate terminal of the first blocking transistor N19. A drain terminal of a second blocking transistor N18 is directly coupled to a gate terminal of the second blocking transistor N18. The first and second blocking transistors N19 and N18 are configured to operate as diodes.

When two or more latch circuits 200 are coupled in parallel, sharing a single clock-enabled transistor P5 to form a multi-bit latch, the transistors P3 and P4 that are connected in series and the transistors P1 and P2 that are also connected in series provide the only paths from the high power supply to the shared clock-enabled supply node 245. Because the transistors P1 and P2 and the transistors P3 and P4 are driven by complementary signals (D1 and D1B), the path from the high power supply to the shared clock-enabled supply node 245 is not enabled. Therefore, one latch circuit 200 of the multi-bit latch is prevented from driving the shared clock-enabled supply node 245 high when the clock CP is high.

Figure 2B:
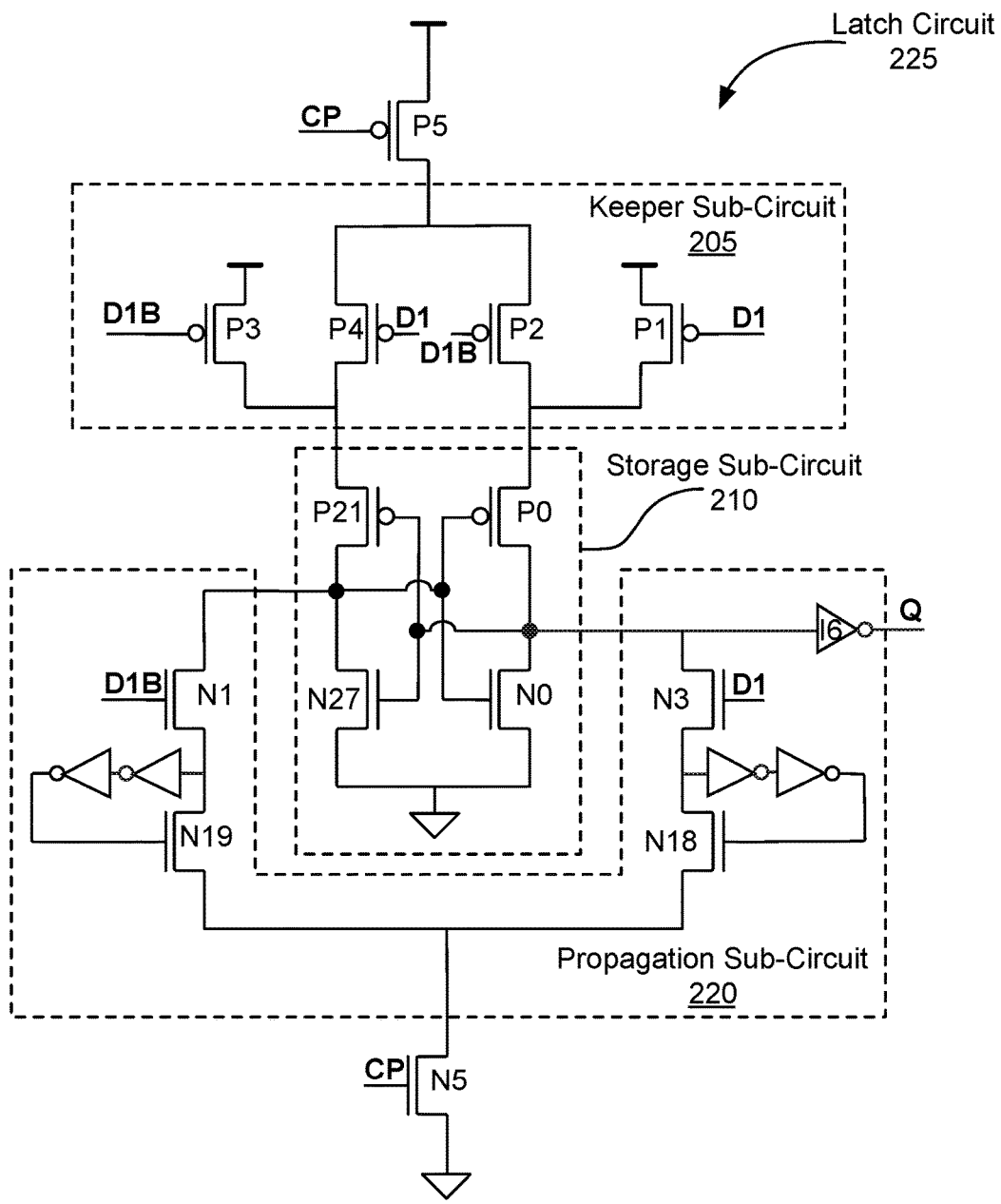
FIG. 2B illustrates another low clock power positive latch circuit, in accordance with one embodiment.

FIG. 2B illustrates another low clock power positive latch circuit 225, in accordance with one embodiment. Compared with the latch circuit 200, the propagation sub-circuit 215 is replaced with the propagation sub-circuit 220 in the latch circuit 225. A drain terminal of the first blocking transistor N19 is coupled to a gate terminal of the first blocking transistor N19 through two inverters. A drain terminal of a second blocking transistor N18 is coupled to a gate terminal of the second blocking transistor N18 through two inverters. The low clock power positive latch circuit 225 operates in the same manner as the low clock power positive latch circuit 200.

Figure 2C:
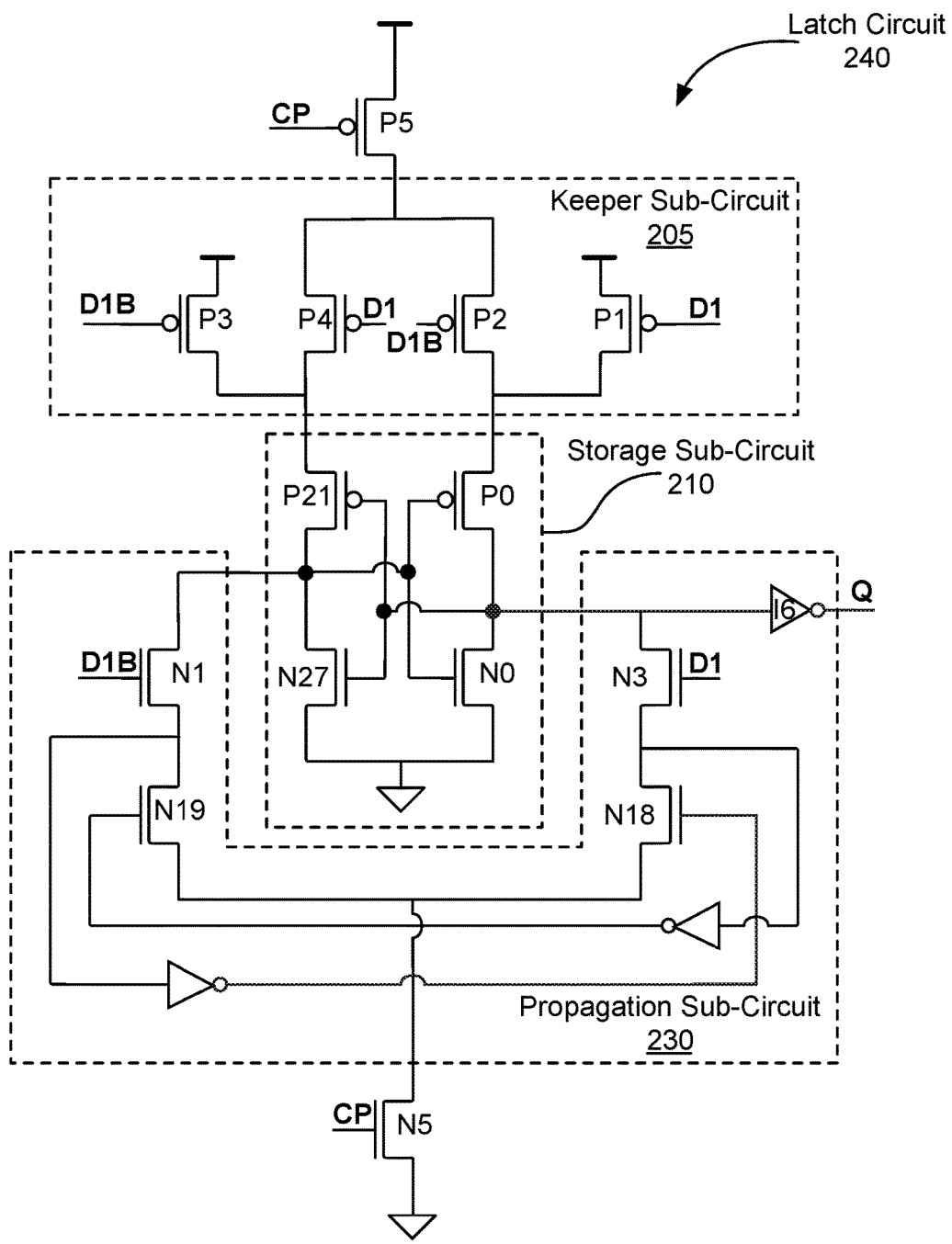
FIG. 2C illustrates another low clock power positive latch circuit, in accordance with one embodiment.

FIG. 2C illustrates another low clock power positive latch circuit 240, in accordance with one embodiment. Compared with the latch circuit 200, the propagation sub-circuit 215 is replaced with the propagation sub-circuit 230 in the latch circuit 240. A drain terminal of a first blocking transistor N19 is coupled through a first inverter to a gate terminal of a second blocking transistor N18. A drain terminal of the blocking transistor N18 is coupled through a second inverter to a gate terminal of the first blocking transistor N19. The low clock power positive latch circuit 240 is completely static and does not rely on sizing relationships between the different transistors. The low clock power positive latch circuit 240 operations are robust, even when the characteristics of the transistors vary due to the fabrication process.

Figure 2D:
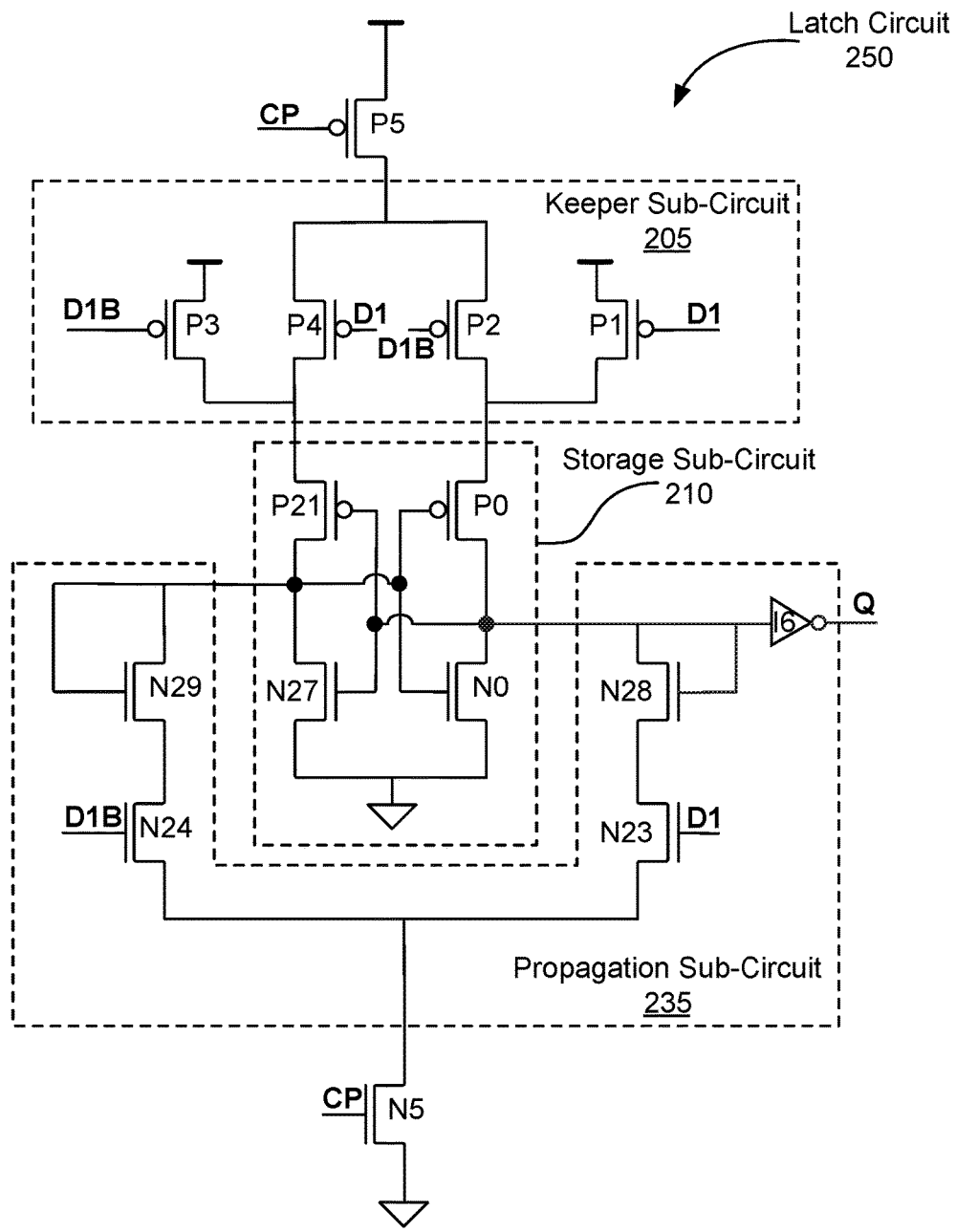
FIG. 2D illustrates another low clock power positive latch circuit, in accordance with one embodiment.

FIG. 2D illustrates another low clock power positive latch circuit 250, in accordance with one embodiment. Compared with the low clock power positive latch circuit 200, a propagation sub-circuit 235 replaces the propagation sub-circuit 215. In the propagation sub-circuit 235, a first blocking transistor N29 is coupled in series with a transistor N24 having a gate terminal coupled to the input signal D1B. The transistor N24 is coupled between the first blocking transistor N29 and a shared clock-enabled supply node at the drain terminal of the clock-enabled transistor N5. A second blocking transistor N28 is coupled in series with a transistor N23 having a gate terminal coupled to the input signal D1. The transistor N23 is coupled between the first blocking transistor N28 and the shared clock-enabled supply node at the drain terminal of the clock-enabled transistor N5. A drain terminal of the first blocking transistor N29 is directly coupled to a gate terminal of the first blocking transistor N29. A drain terminal of the second blocking transistor N28 is directly coupled to a gate terminal of the second blocking transistor N28. The first and second blocking transistors N29 and N28 are configured to operate as diodes.

Figure 3A:
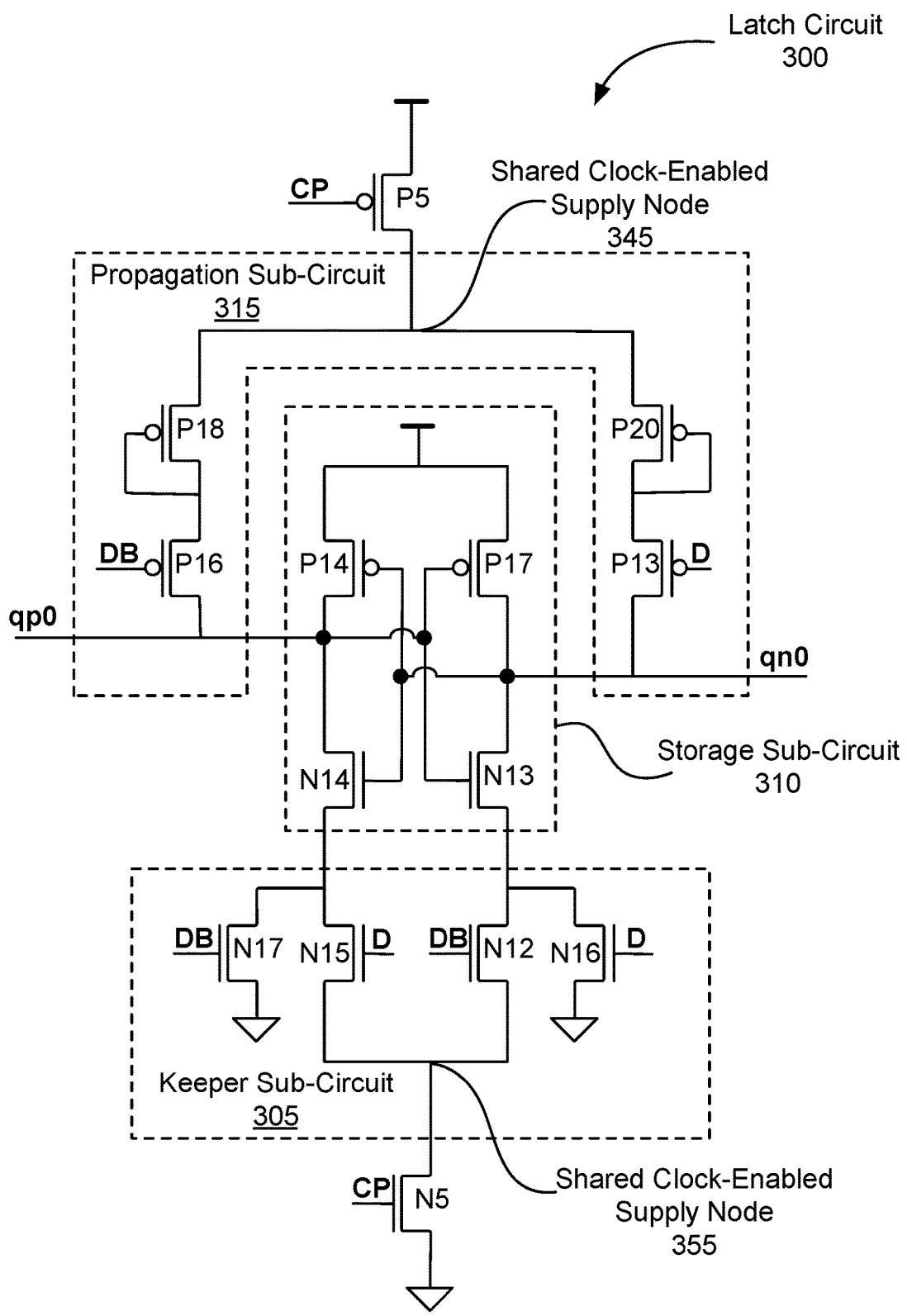
FIG. 3A illustrates a low clock power negative latch circuit, in accordance with one embodiment.

FIG. 3A illustrates a low clock power negative latch circuit 300, in accordance with one embodiment. As shown in FIG. 3A transistors N5, N12, N13, N14, N15, N16, and N17 are NMOS devices and transistors P5, P13, P14, P16, P17, P18, and P20 are PMOS devices. The latch circuit 300 is a mirror of the latch circuit 200 with the NMOS and PMOS devices swapped. The latch circuit 300 includes only two clock-enabled transistors, shared clock-enabled transistor P5 and shared clock-enabled transistor N5. When the negative latch circuit 300 is combined with one or more of the positive latch circuits 200, 225, 240, or 250, the clock-enabled transistors N5 and P5 may be shared. The clock-enabled transistor P5 is coupled between a high power supply (e.g., VDD) and a shared clock-enabled supply node 345 within a propagation sub-circuit 315. The clock-enabled transistor N5 is coupled between a low power supply (e.g., ground) and a shared clock-enabled supply node 355 within a keeper sub-circuit 305. A storage sub-circuit 310 is coupled between the keeper sub-circuit 305 and the propagation sub-circuit 315.

When the clock signal CP is low, the latch circuit 300 is transparent so that a voltage level of an input signal D propagates to an output signal qp0. An input signal DB is an inverted version of the input signal D. When the clock signal CP transitions from low to high, the level of the input signal D is captured and stored in the storage sub-circuit 310. When the clock signal CP is high, the output signal qn0 is held at the captured level. An output signal qp0 is the complement of the output signal qn0. The output signal qn0 may be connected to the input D1B of a positive latch circuit, such as one or more of the positive latch circuits 200, 225, 240, or 250, and the output signal qp0 may be connected to the input D1 of the positive latch circuit to form a flip-flop.

The storage sub-circuit 310 includes two cross-coupled inverters configured to capture and store the level of the input signal D. A first inverter is formed by the transistors P17 and N13 and a second inverter is formed by the transistors P14 and N14. A voltage level of the input D and inverted input DB is stored into the storage sub-circuit 310 when the propagation sub-circuit 315 drives a high power supply voltage onto an input of one of the two cross-coupled inverters within the storage sub-circuit 310 while the transistor P5 is enabled (e.g., when CP is low).

When the clock CP is high, the transistor P5 is disabled and the high power supply voltage path to write the storage sub-circuit 310 is disabled. The low power supply voltage paths to both of the cross-coupled inverters within the storage sub-circuit 310 are enabled when the clock CP is high. For example, when the input D is high, DB is low, and the transistors N15 and N16 are both enabled. When the input D is low, DB is high, and the transistors N12 and N17 are both enabled. The clock-enabled transistor N5 provides a path from the shared clock-enabled supply node 355 to the low power supply voltage when CP is high.

In contrast, the storage sub-circuit 310 is coupled to a low power supply voltage by only one of transistors N16 or N17. When CP is low the storage sub-circuit 310 may be written and the latch circuit 300 is transparent (i.e., the voltage level of input D is propagated to the output qp0 and the voltage level of input DB is propagated to the output qn0). When the input D equals qp0, the storage sub-circuit 310 is not written. For example, when D and qp0 are both high, the transistor P13 is disabled and the transistors N16 and P16 are enabled, so that the gates of transistors P17 and N13 are high. The transistor N13 is enabled to maintain qn0 at a low voltage level and qp0 maintains a high voltage level. Although the gates of transistors P17 and N13 are connected to the drain of the clock-enabled transistor N5 via N14 and N15, the clock-enabled transistor N5 is off, thereby preventing a connection to the low power supply and a fight between the cross-coupled inverters.

When D and qp0 are both low, the transistor P16 is disabled and the transistors P13 and N17 are enabled, so that qn0 is maintained high. The transistor N14 is enabled to maintain qp0 at a low voltage level. Although the gates of transistors P14 and N14 are connected to the drain of the clock-enabled transistor N5 via N13 and N12, the clock-enabled transistor N5 is off, thereby preventing a connection to the low power supply and a fight between the cross-coupled inverters.

When CP is low and the storage sub-circuit 310 is written, the voltage level of the output qp0 transitions to equal the input D. When the input D transitions to a high level while the output qp0 is low, the transistor N16 is enabled, the transistors N17 and P13 are disabled, and the transistor P16 is enabled, so that the gates of transistors P17 and N13 are pulled high. The transistor N16 provides a path between the transistor N13 and the low power supply. The transistor N13 is enabled to pull the gates of transistors P14 and N14 low. P14 is enabled to drive the qp0 high and qn0 transitions to a low voltage level. The transistor N17 is off and although the transistor N15 is enabled, the clock-enabled transistor N5 is off, thereby a connection to the low power supply is prevented and a fight between the cross-coupled inverters is avoided.

When the input D transitions to a low level while the output qp0 is high, the transistor N17 is enabled, the transistors P16 and N16 are disabled, and the transistor P13 is enabled, so that the gates of transistors P14 and N14 are pulled high. The transistor N17 provides a path between the transistor N14 and the low power supply. The transistor N14 is enabled to pull the output qp0 low and the output qn0 transitions to a high voltage level. The transistor N16 is off and although the transistor N12 is enabled, the clock-enabled transistor N5 is off, thereby a connection to the low power supply is prevented and a fight between the cross-coupled inverters is avoided.

Because the shared clock-enabled supply node 355 is not driven low when the transistor N5 is off and the shared clock-enabled supply node 345 is not driven high when the transistor P5 is off, the latch circuit 300 operates correctly. Importantly, when two or more latch circuits 300 are coupled in parallel, sharing a single clock-enabled transistor P5 to form a multi-bit latch, blocking transistors P20 and P18 prevent one latch circuit 300 from driving the shared clock-enabled supply node 345 high when the clock CP is high. A drain terminal of a first blocking transistor P20 is directly coupled to a gate terminal of the first blocking transistor P20. A drain terminal of a second blocking transistor P18 is directly coupled to a gate terminal of the second blocking transistor P18. The first and second blocking transistors P20 and P18 are configured to operate as diodes.

When two or more latch circuits 300 are coupled in parallel, sharing a single clock-enabled transistor N5 to form a multi-bit latch, the transistors N17 and N15 that are connected in series and the transistors N16 and N12 that are also connected in series provide the only paths from the low power supply to the shared clock-enabled supply node 355. Because the transistors N17 and N15 and the transistors N16 and N12 are driven by complementary signals (D and DB), the path from the low power supply to the shared clock-enabled supply node 355 is not enabled. Therefore, one latch circuit 300 of the multi-bit latch is prevented from driving the shared clock-enabled supply node 355 low when the clock CP is low. When a negative latch circuit 300 is coupled to a positive latch circuit, such as latch circuit 200, 225, 240, and 250, to form a flip-flop, the shared clock-enabled supply nodes 255 and 355 are prevented from being driven low when the clock CP is low. Similarly, when a negative latch circuit 300 is coupled to a positive latch circuit to form a flip-flop, the shared clock-enabled supply nodes 245 and 345 are prevented from being driven high when the clock CP is high.

Figure 3B:
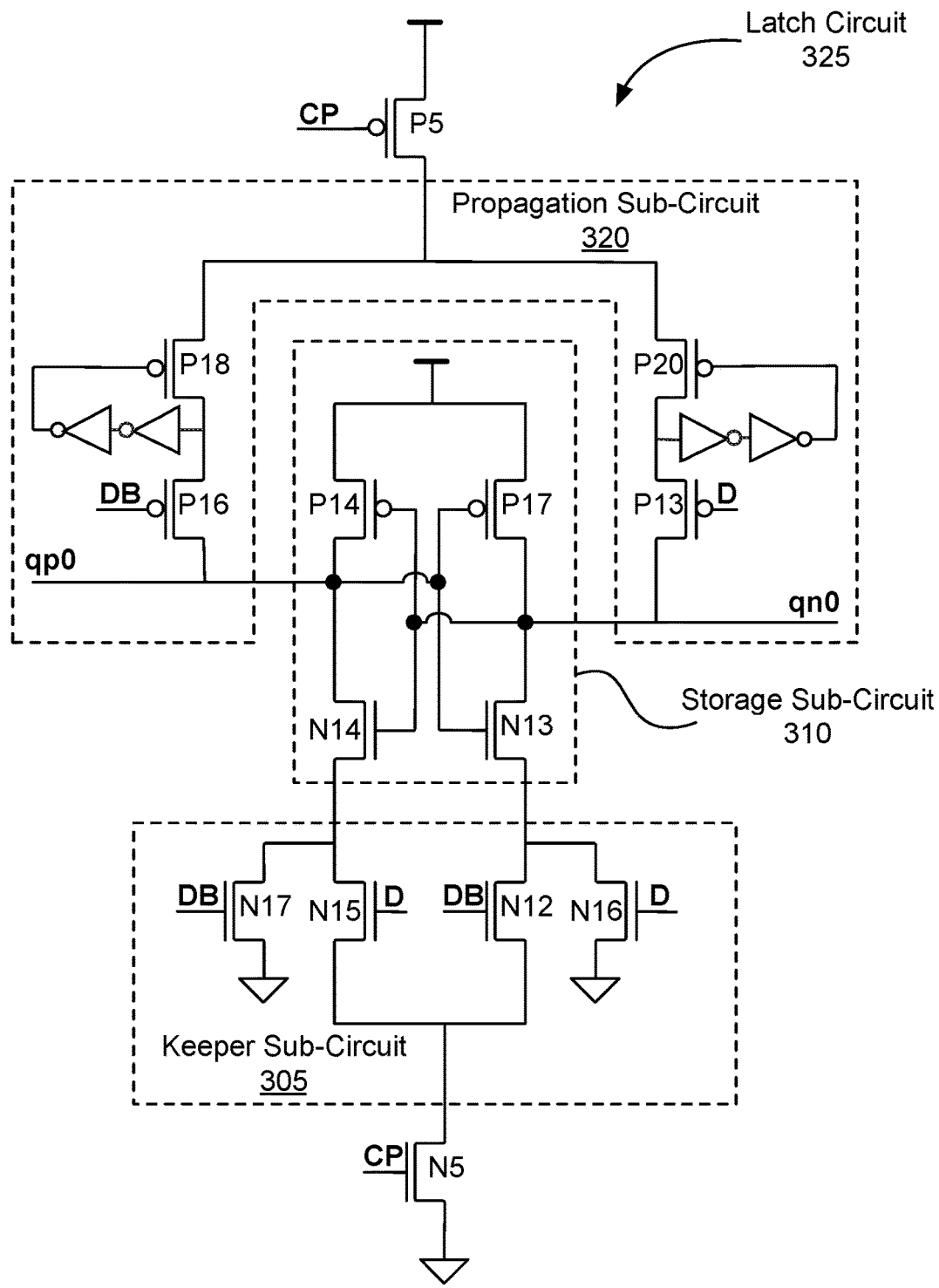
FIG. 3B illustrates another low clock power negative latch circuit, in accordance with one embodiment.

FIG. 3B illustrates another low clock power negative latch circuit 325, in accordance with one embodiment. Compared with the low clock power negative latch circuit 300, the propagation sub-circuit 315 is replaced with the propagation sub-circuit 320 in the low clock power negative latch circuit 325. A drain terminal of a first blocking transistor P20 is coupled to a gate terminal of the first blocking transistor P20 through two inverters. A drain terminal of a second blocking transistor P18 is coupled to a gate terminal of the second blocking transistor P18 through two inverters.

Figure 3C:
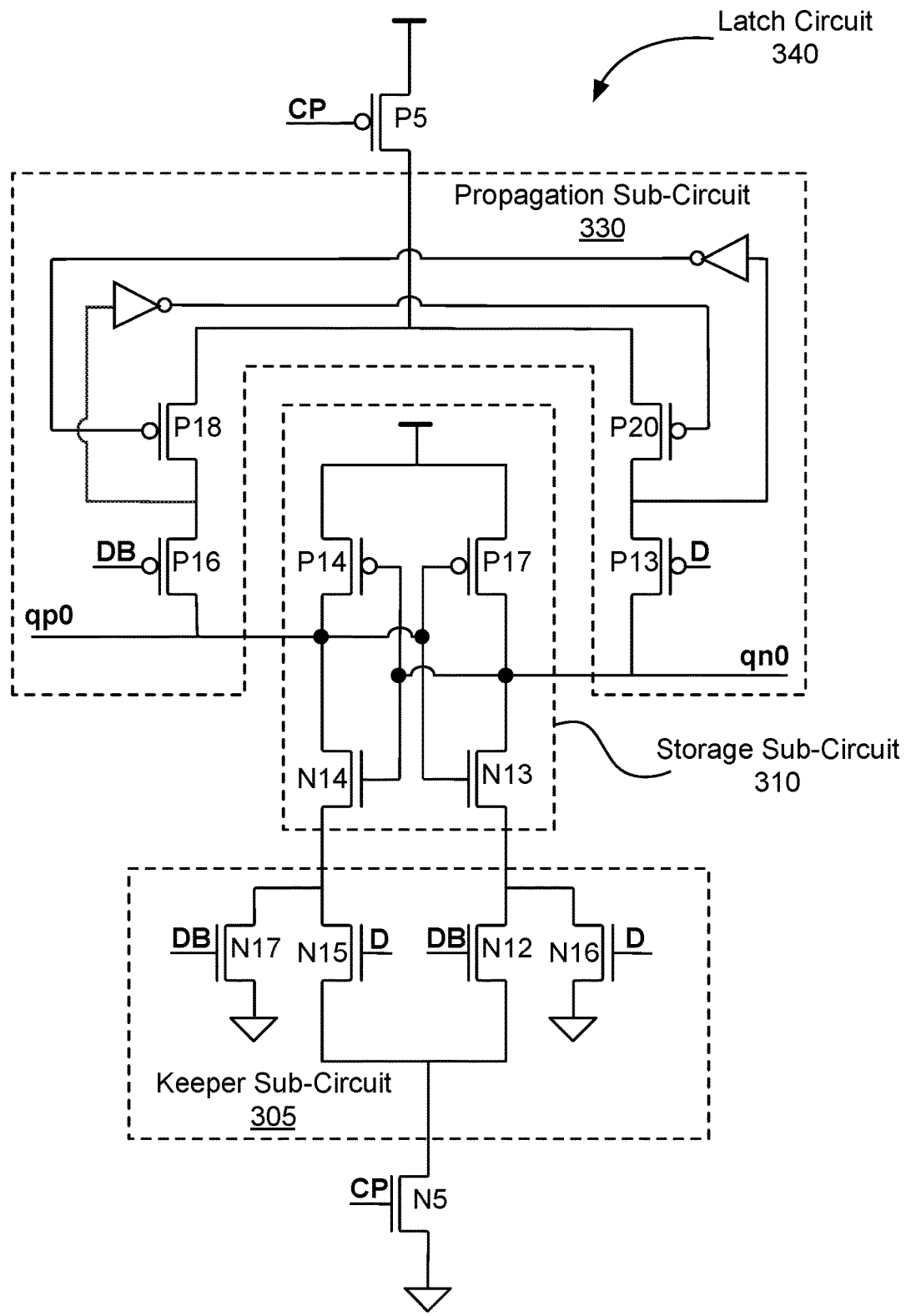
FIG. 3C illustrates another low clock power negative latch circuit, in accordance with one embodiment.

FIG. 3C illustrates another low clock power negative latch circuit 340, in accordance with one embodiment. Compared with the low clock power negative latch circuit 300, the propagation sub-circuit 315 is replaced with the propagation sub-circuit 330 in the low clock power negative latch circuit 340. A drain terminal of a first blocking transistor P20 is coupled through a first inverter to a gate terminal of a second blocking transistor P18. A drain terminal of the blocking transistor P18 is coupled through a second inverter to a gate terminal of the first blocking transistor P20.

Figure 3D:
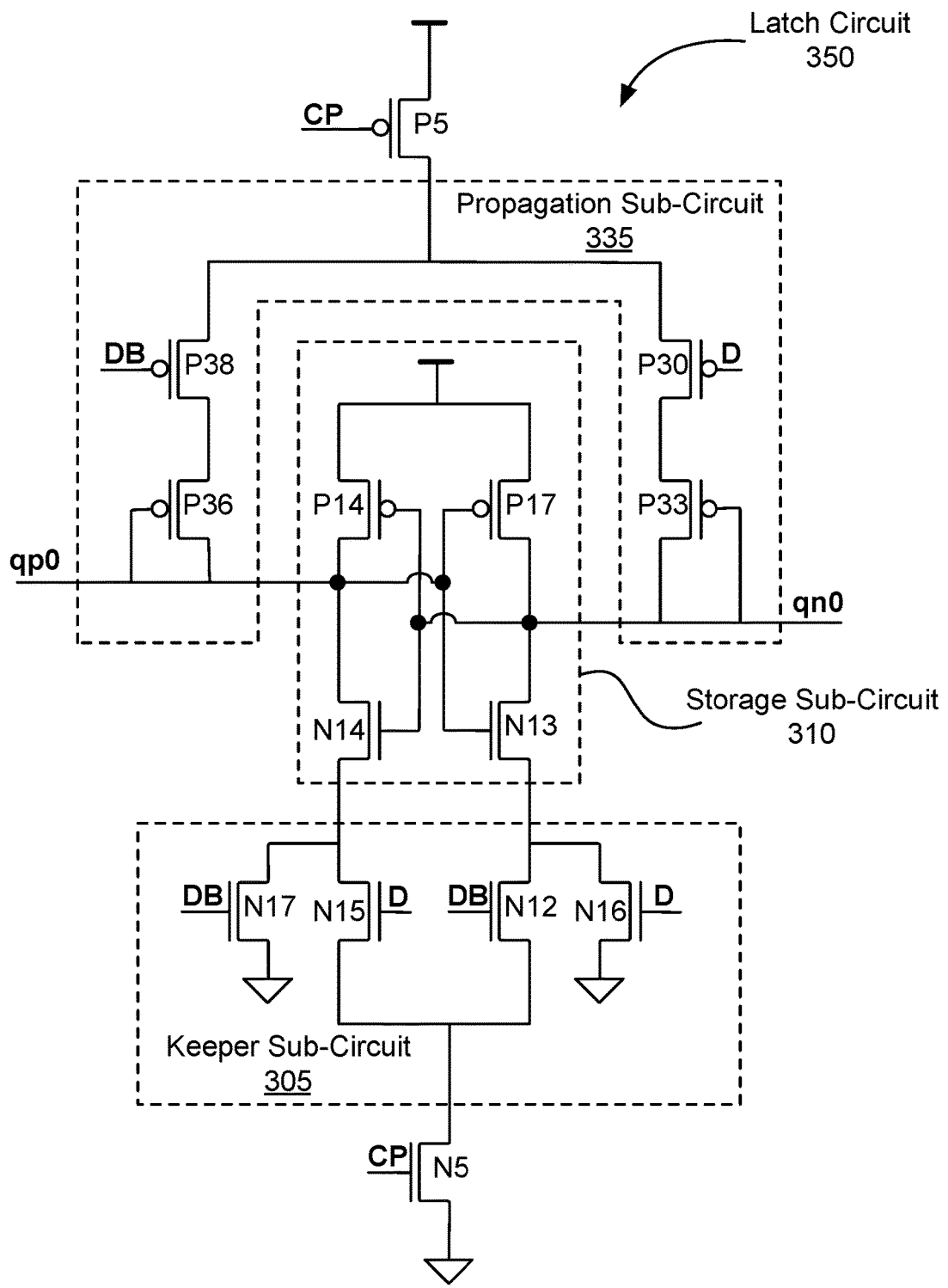
FIG. 3D illustrates another low clock power negative latch circuit, in accordance with one embodiment.

FIG. 3D illustrates another low clock power negative latch circuit 350, in accordance with one embodiment. Compared with the low clock power negative latch circuit 300, a propagation sub-circuit 335 replaces the propagation sub-circuit 315. In the propagation sub-circuit 335, a first blocking transistor P36 is coupled in series with a transistor P38 having a gate terminal coupled to the input signal DB. The transistor P38 is coupled between the first blocking transistor P36 and a shared clock-enabled supply node at the drain terminal of the clock-enabled transistor P5. The first blocking transistor P33 is coupled in series with a transistor P30 having a gate terminal coupled to the input signal D. The transistor P30 is coupled between the first blocking transistor P33 and the shared clock-enabled supply node at the drain terminal of the clock-enabled transistor P5. A drain terminal of the first blocking transistor P36 is directly coupled to a gate terminal of the first blocking transistor P36. A drain terminal of the second blocking transistor P33 is directly coupled to a gate terminal of the second blocking transistor P33. The first and second blocking transistors P36 and P33 are configured to operate as diodes.

Figure 4:
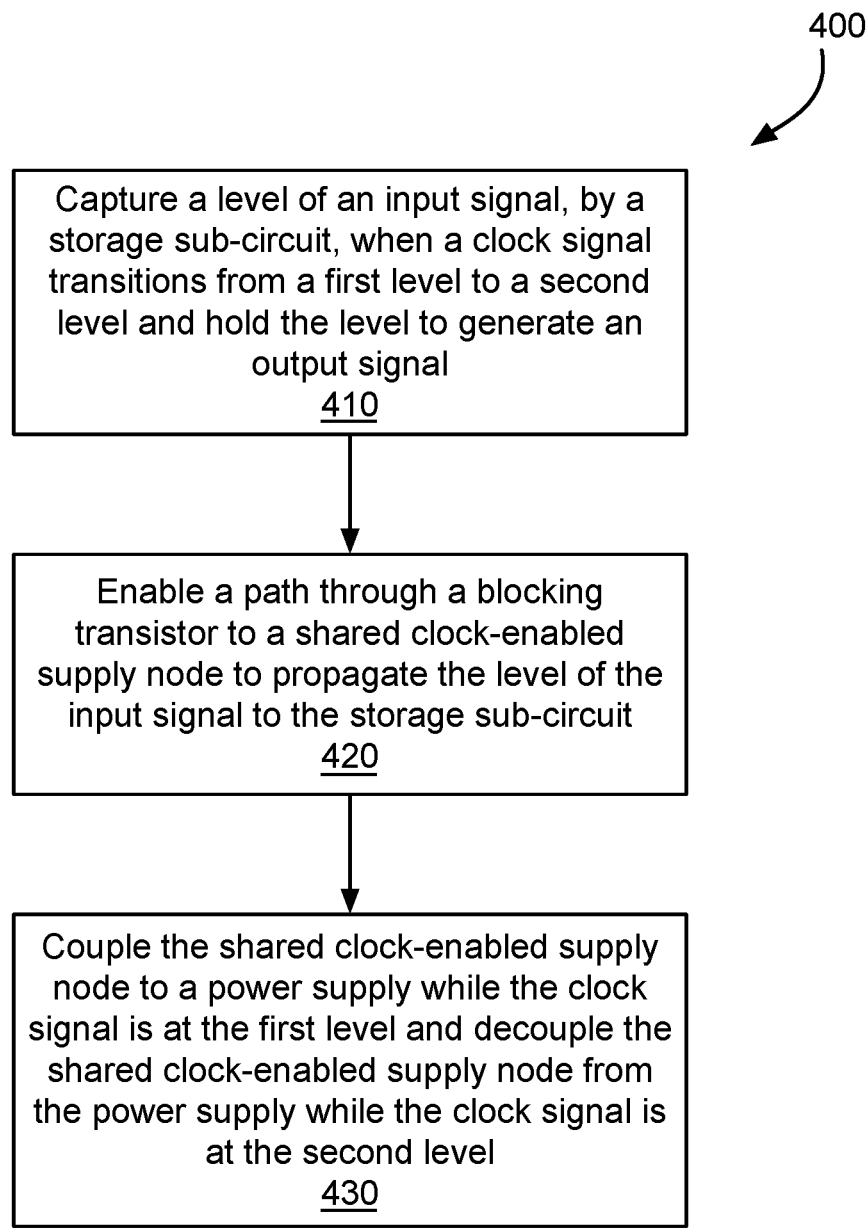
FIG. 4 illustrates a flowchart of a method for operating a low clock power latch circuit, in accordance with one embodiment.

FIG. 4 illustrates a flowchart 400 of a method for operating a low clock power latch circuit, in accordance with one embodiment. In one embodiment, the low clock power latch circuit comprises the storage sub-circuit 210, the propagation sub-circuit 215, 220, 230, or 235, and the shared clock-enabled transistor N5. In another embodiment, the low clock power latch circuit comprises the storage sub-circuit 310, the propagation sub-circuit 315, 320, 330, or 335, and the shared clock-enabled transistor P5. At step 410, the storage sub-circuit captures a level of an input signal when a clock signal transitions from a first level to a second level and holds the captured level to generate an output signal while the clock signal is at the second level. At step 420, the propagation sub-circuit enables a path through a blocking transistor to the shared clock-enabled supply node to propagate the captured level of the input signal to the storage sub-circuit. At step 430, the shared clock-enabled transistor couples the shared clock-enabled supply node to a power supply while the clock signal is at the first level and decouples the shared clock-enabled supply node from the power supply while the clock signal is at the second level.

Figure 5A:
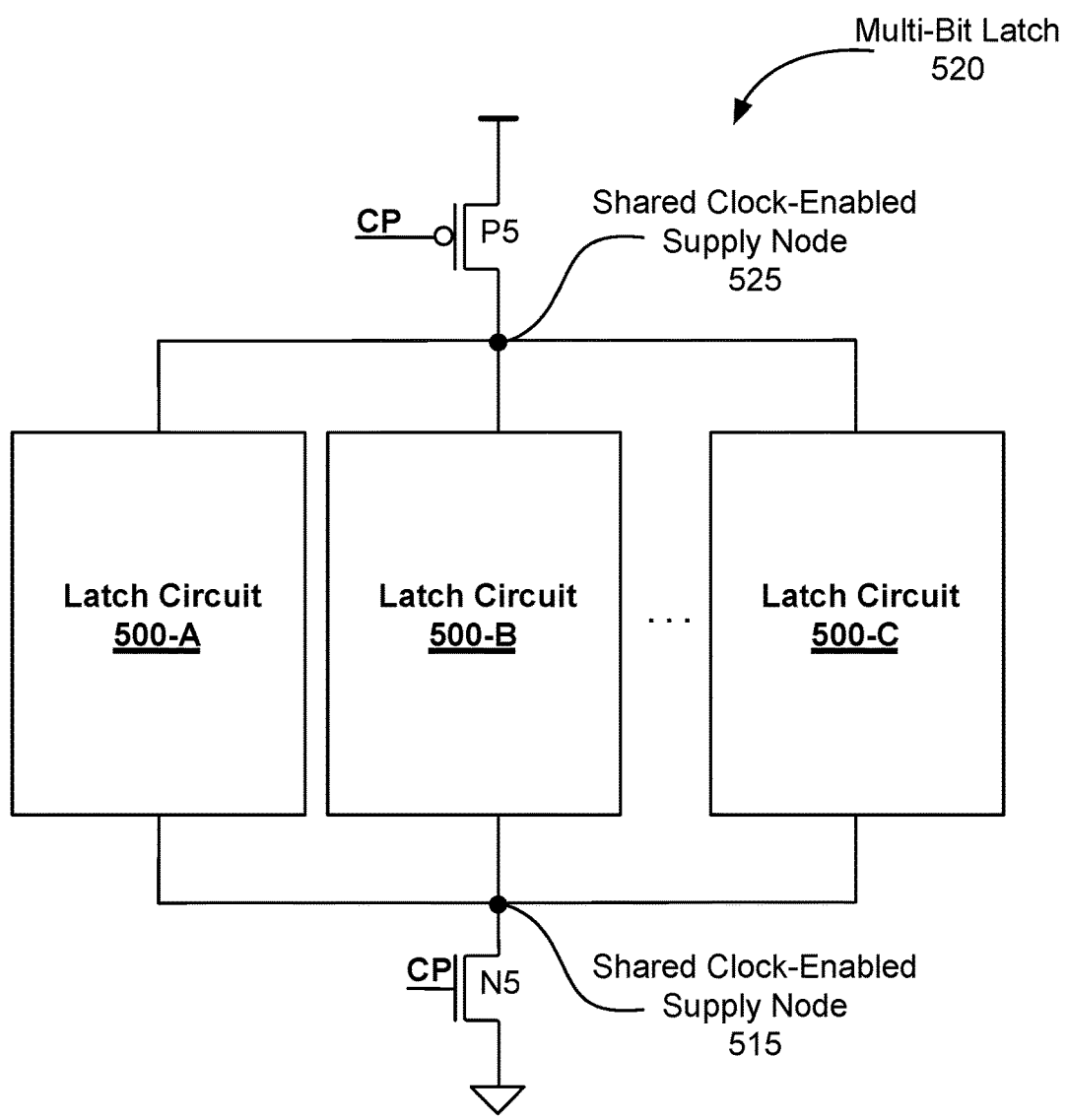
FIG. 5A is a block diagram illustrating a multi-bit latch constructed using low-clock-energy latch circuits, in accordance with one or more aspects of the present invention.

FIG. 5A is a block diagram illustrating a multi-bit latch 520 constructed using low-clock-energy latch circuits 500-A, 500-B, and 500-C, in accordance with one or more aspects of the present invention. Each of the latch circuits 500-A, 500-B, and 500-C may be a latch circuit 200, 225, 240, 250, 300, 325, 340, or 350. Two or more latch circuits 500 may share a single clock-enabled pull-up transistor P5 at a shared clock-enabled supply node 525 and a single clock-enabled pull-down transistor N5 at a shared clock-enabled supply node 515 to form a multi-bit latch 520. Therefore, the number of transistor device loads on the clock signal per-bit of latch circuit is less than or equal to one and the clock energy is reduced significantly compared with latch circuits having greater loads on the clock signal. In one embodiment, any number of positive latch circuits, negative latch circuits, and flip-flops can be combined into a single standard cell by sharing a single clock-enabled pull-up transistor P5 and a single clock-enabled pull-down transistor N5.

The latch circuits 500-A, 500-B, and 500-C operate correctly without requiring transistor devices having a specific relative sizing. The multi-bit latch 520 operations are robust, even when the characteristics of the transistors vary due to the fabrication process given a reasonable sizing of transistors. In practice, the sizes of the clock-enabled transistors N5 and P5 and number of latches 500 in a standard cell directly affect the speed of the standard cell, so scaling to large numbers of latch circuits 500 with very weak clock transistors is not advised. In one embodiment, clock-enabled transistors P5 and N5 are shared between 2-4 latch circuits 500.

Figure 5B:
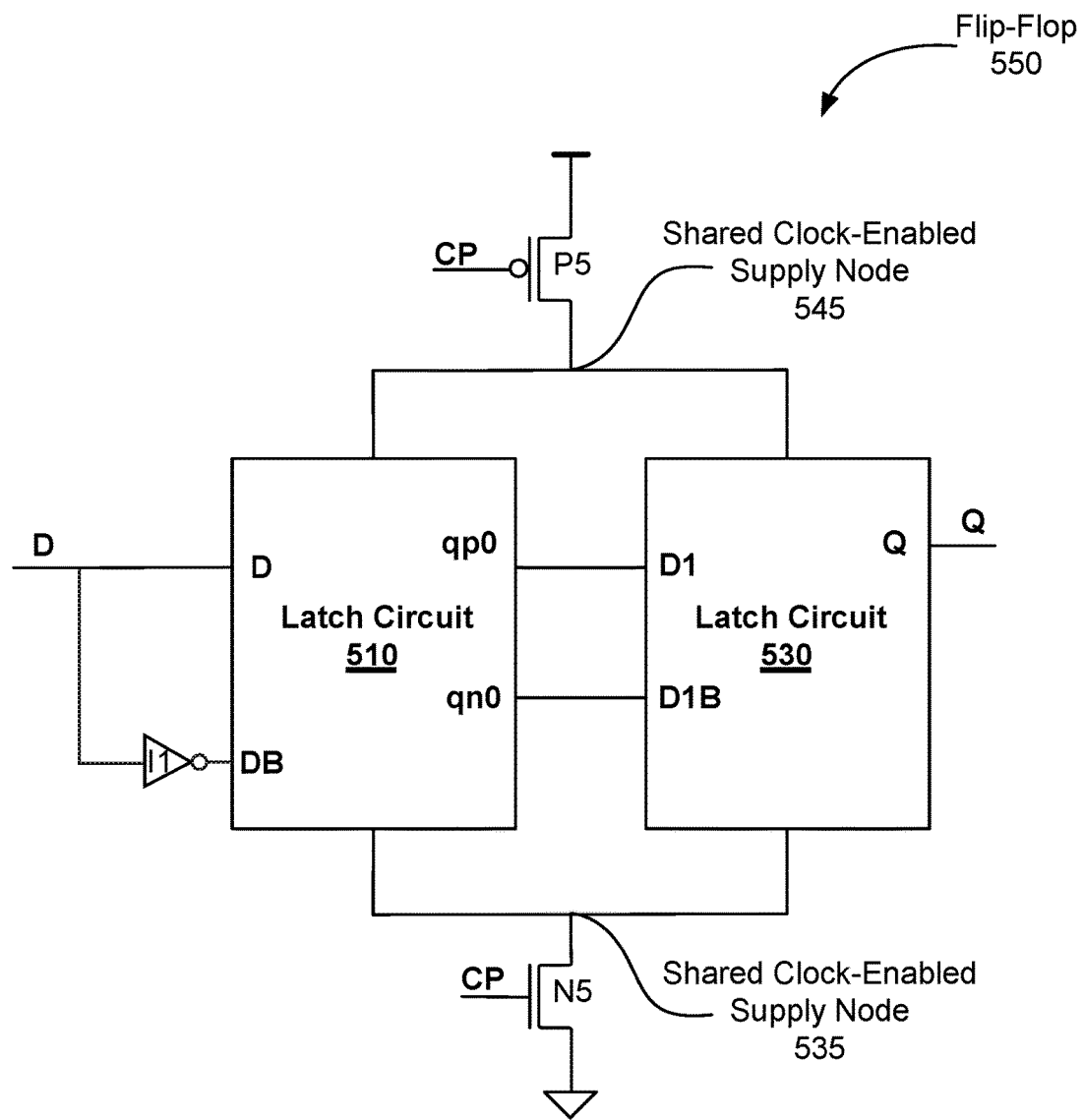
FIG. 5B is a block diagram illustrating a flip-flop constructed using low-clock-energy latch circuits, in accordance with one or more aspects of the present invention.

FIG. 5B is a block diagram illustrating a flip-flop 550 constructed using low-clock-energy latch circuits 510 and 530, in accordance with one or more aspects of the present invention. The latch circuit 510 may be a latch circuit 300, 325, 340, or 350 and the latch circuit 530 may be a latch circuit 200, 225, 240, or 250. The latch circuit 510 is a negative latch that is transparent when the clock CP is low and latch 530 is a positive latch that is transparent when the clock CP is high. Therefore, the flip-flop 550 can be realized without the need to invert the clock signal CP. The storage node qp0 from the latch circuit 510 is coupled to the input signal D1 of the latch circuit 530 and the storage node qn0 from the latch circuit 510 is coupled to the input signal D1B of the latch circuit 530. The inverter I1 generates the input signal DB by inverting the input signal D.

The latch circuits 510 and 530 may share a single clock-enabled pull-up transistor P5 and a single clock-enabled pull-down transistor N5 to form the flip-flop 550. In one embodiment, the latch circuits 510 and 530 share a single clock-enabled pull-up transistor P5 at a shared clock-enabled supply node 545 and a single clock-enabled pull-down transistor N5 at a shared clock-enabled supply node 535 with additional latch circuits 510 and/or 530. In one embodiment, the latch circuits 510 and 530 are multi-bit latch circuits and the flip-flop 550 is a multi-bit flip-flop. Therefore, the number of transistor device loads on the clock signal per-flip-flop is less than or equal to one and the clock energy is reduced significantly compared with latch circuits having greater loads on the clock signal.

The latch circuits 510 and 530 operate correctly without requiring transistor devices having a specific relative sizing. In practice, the sizes of the clock-enabled transistors N5 and P5 and number of latch circuits 510 and 530 in a standard cell directly affect the speed of the standard cell, so scaling to large numbers of latch circuits 510 and 530 with very weak clock transistors is not advised. In one embodiment, clock-enabled transistors P5 and N5 are shared between 2-4 latch circuits 510 and/or 530.

Figure 6:
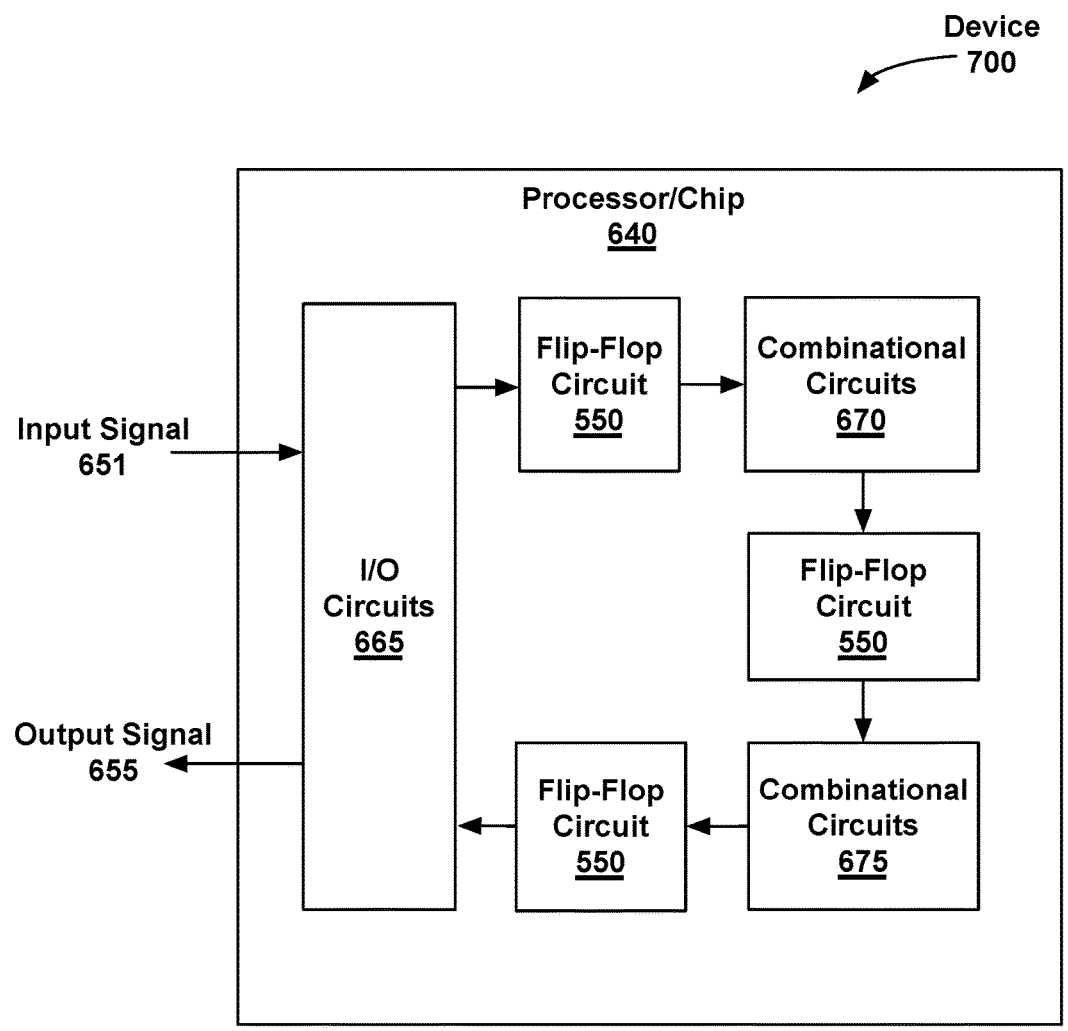
FIG. 6 is a block diagram illustrating a processor/chip including the flip-flop from FIG. 5B, in accordance with one or more aspects of the present invention.

FIG. 6 is a block diagram illustrating a processor/chip 640 including the flip-flop circuit 550 from FIG. 5B, in accordance with one or more aspects of the present invention. I/O circuits 665 may include pads and other I/O specific circuits to send and receive signals from other devices in a system. Output signal 655 is produced by I/O circuits 665 based on signals received by the I/O circuits 665. The input signal 651 is received by the I/O circuits 665 and is input to the first flip-flop circuit 550 for storage. The I/O circuits 665 also provide clock signals to the flip-flop circuits 550.

In one embodiment, the flip-flop circuits 550 share the clock-enabled transistors P5 and N5. In another embodiment, each flip-flop circuit 550 is a multi-bit flip-flop circuit that comprises multiple flip-flops 550 sharing a single P5 clock-enabled pull-up transistor and a single N5 clock-enabled pull-down transistor. The combinational circuits 670 receive the output generated by the first flip flop circuit 550 and generate a combinational output that is received by the second flip-flop circuit 550. The second flip-flop circuit 550 stores the combinational output and generates an output that is input to the combinational circuits 675. The output of the combinational circuits 675 is received and stored by the third flip-flop circuit 550. The third flip-flop circuit 550 generates an output that is provided to the I/O circuits 665. The flip-flop circuits 550 may be used to store signals for multiple clock cycles or to pipeline signals that change as frequently as each clock cycle. Multiple flip-flop circuits 550 may also be used in an array to form a register file with a single P5 clock-enabled pull-up transistor and a single N5 clock-enabled pull-down transistor shared between one or more subsets of the flip flops 550 in the register file.

System Overview

In sum, the low-clock-energy latch circuits 200, 225, 240, 250, 300, 325, 340, and 350 reduce the transistor device load on the clock signal CP to only two transistor gates and are fully static. The clock energy is reduced significantly compared with latch and/or flip-flop circuits having greater loads on the clock signal and does not rely on specific sizing relationships between the different transistors to function properly. Additionally, the low-clock energy latch circuits 200, 225, 240, 250, 300, 325, 340, and 350 may be combined to form multi-bit latches, flip-flops, and multi-bit flip-flops by sharing the clock-enabled transistors N5 and P5.

Figure 7:
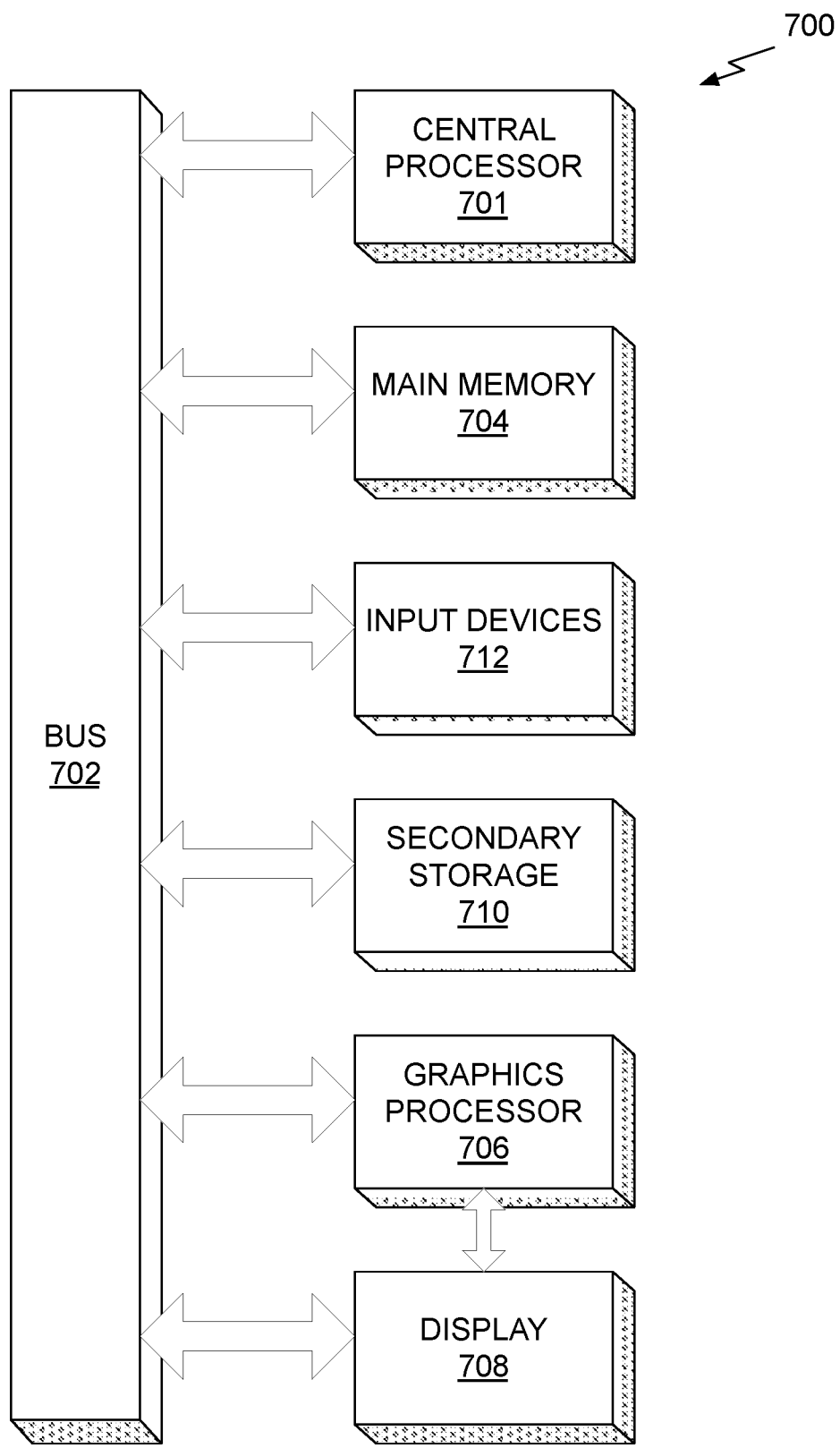
FIG. 7 illustrates an exemplary system in which the various architecture and/or functionality of the various previous embodiments may be implemented.

FIG. 7 illustrates an exemplary system 700 in which the various architecture and/or functionality of the various previous embodiments may be implemented. As shown, a system 700 is provided including at least one central processor 701 that is connected to a communication bus 702. The communication bus 702 may be implemented using any suitable protocol, such as PCI (Peripheral Component Interconnect), PCI-Express, AGP (Accelerated Graphics Port), HyperTransport, or any other bus or point-to-point communication protocol(s). The system 700 also includes a main memory 704. Control logic (software) and data are stored in the main memory 704 which may take the form of random access memory (RAM).

The system 700 also includes input devices 712, a graphics processor 706, and a display 708, i.e. a conventional CRT (cathode ray tube), LCD (liquid crystal display), LED (light emitting diode), plasma display or the like. User input may be received from the input devices 712, e.g., keyboard, mouse, touchpad, microphone, and the like. In one embodiment, the graphics processor 706 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 700 may also include a secondary storage 710. The secondary storage 710 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 704 and/or the secondary storage 710. Such computer programs, when executed, enable the system 700 to perform various functions. The memory 704, the storage 710, and/or any other storage are possible examples of computer-readable media.

In one embodiment, the architecture and/or functionality of the various previous figures may be implemented in the context of the central processor 701, the graphics processor 706, an integrated circuit (not shown) that is capable of at least a portion of the capabilities of both the central processor 701 and the graphics processor 706, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 700 may take the form of a desktop computer, laptop computer, server, workstation, game consoles, embedded system, and/or any other type of logic. Still yet, the system 700 may take the form of various other devices including, but not limited to a personal digital assistant (PDA) device, a mobile phone device, a television, etc.

Further, while not shown, the system 700 may be coupled to a network (e.g., a telecommunications network, local area network (LAN), wireless network, wide area network (WAN) such as the Internet, peer-to-peer network, cable network, or the like) for communication purposes.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A latch circuit, comprising:
  a storage sub-circuit configured to capture a level of an input signal when a clock signal transitions from a first level to a second level and hold the level to generate an output signal while the clock signal is at the second level;
  a propagation sub-circuit configured to enable a path through a blocking transistor to a shared clock-enabled supply node to propagate the level of the input signal to the storage sub-circuit, wherein the propagation sub-circuit comprises:
    a first input transistor that receives the input signal and is coupled in series with the blocking transistor; and
    a second input transistor that receives an inverted input signal and is coupled in series with a second blocking transistor; and
  a shared clock-enabled transistor configured to couple the shared clock-enabled supply node to a power supply while the clock signal is at the first level and decouple the shared clock-enabled supply node from the power supply while the clock signal is at the second level.

2. The latch circuit of claim 1, wherein the blocking transistor is coupled between the first input transistor and the shared clock-enabled supply node.

3. The latch circuit of claim 1, wherein the first input transistor is coupled between the blocking transistor and the shared clock-enabled supply node.

4. The latch circuit of claim 1, wherein a drain terminal of the blocking transistor is coupled through an inverter to a gate terminal of the second blocking transistor.

5. The latch circuit of claim 1, wherein a drain terminal of the blocking transistor is directly coupled to a gate terminal of the blocking transistor.

6. The latch circuit of claim 1, wherein a drain terminal of the blocking transistor is coupled to a gate terminal of the blocking transistor through at least one inverter.

7. The latch circuit of claim 1, wherein the first level is high and the second level is low.

8. The latch circuit of claim 1, wherein the power supply is a low power supply.

9. The latch circuit of claim 1, wherein the shared clock-enabled transistor is an n-type metal-oxide semiconductor (NMOS) device.

10. The latch circuit of claim 1, wherein the blocking transistor is an n-type metal-oxide semiconductor (NMOS) device.

11. A latch circuit, comprising:
a storage sub-circuit configured to capture a level of an input signal when a clock signal transitions from a first level to a second level and hold the level to generate an output signal while the clock signal is at the second level;
a propagation sub-circuit configured to enable a path through a blocking transistor to a shared clock-enabled supply node to propagate the level of the input signal to the storage sub-circuit;
a shared clock-enabled transistor configured to couple the shared clock-enabled supply node to a power supply while the clock signal is at the first level and decouple the shared clock-enabled supply node from the power supply while the clock signal is at the second level; and
a keeper sub-circuit configured to enable a second path from a second shared clock-enabled supply node to the storage sub-circuit.

12. The latch circuit of claim 11, wherein the clock signal drives only the shared clock-enabled transistor and the second shared clock-enabled transistor.

13. The latch circuit of claim 11, further comprising a second shared clock-enabled transistor that is configured to couple the second shared clock-enabled supply node to a second power supply while the clock signal is at the second level and decouple the second shared clock-enabled supply node from the second power supply while the clock signal is at the first level.

14. The latch circuit of claim 13, wherein the second power supply is a high power supply.

15. A latch circuit, comprising:
a storage sub-circuit configured to capture a level of an input signal when a clock signal transitions from a first level to a second level and hold the level to generate an output signal while the clock signal is at the second level;
a propagation sub-circuit configured to enable a path through a blocking transistor to a shared clock-enabled supply node to propagate the level of the input signal to the storage sub-circuit; and
a shared clock-enabled transistor configured to couple the shared clock-enabled supply node to a power supply while the clock signal is at the first level and decouple the shared clock-enabled supply node from the power supply while the clock signal is at the second level, wherein the shared clock-enabled supply node is coupled to a second latch circuit.

16. The latch circuit of claim 15, wherein the second latch circuit and the latch circuit form a multi-bit latch circuit.

17. The latch circuit of claim 15, wherein an output signal of the second latch circuit is coupled to the input signal of the latch circuit to form a flip-flop.

18. A method for operating a latch circuit, comprising:
capturing a level of an input signal, by a storage sub-circuit, when a clock signal transitions from a first level to a second level and hold the captured level to generate an output signal;
enabling, by a propagation sub-circuit, a path through a blocking transistor to a shared clock-enabled supply node to propagate the captured level of the input signal to the storage sub-circuit, wherein the propagation sub-circuit comprises:
a first input transistor that receives the input signal and is coupled in series with the blocking transistor; and
a second input transistor that receives an inverted input signal and is coupled in series with a second blocking transistor; and
coupling the shared clock-enabled supply node to a power supply while the clock signal is at the first level and decouple the shared clock-enabled supply node from the power supply while the clock signal is at the second level.

19. A method for operating a latch circuit, comprising:
capturing a level of an input signal, by a storage sub-circuit, when a clock signal transitions from a first level to a second level and hold the captured level to generate an output signal;
enabling a path through a blocking transistor to a shared clock-enabled supply node to propagate the captured level of the input signal to the storage sub-circuit; and
coupling the shared clock-enabled supply node to a power supply while the clock signal is at the first level and decouple the shared clock-enabled supply node from the power supply while the clock signal is at the second level; and
enabling a second path from a second shared clock-enabled supply node to the storage sub-circuit, by a keeper sub-circuit, while the clock signal is at the second level.

20. A method for operating a latch circuit, comprising:
capturing a level of an input signal, by a storage sub-circuit, when a clock signal transitions from a first level to a second level and hold the captured level to generate an output signal;
enabling a path through a blocking transistor to a shared clock-enabled supply node to propagate the captured level of the input signal to the storage sub-circuit; and
coupling the shared clock-enabled supply node to a power supply while the clock signal is at the first level and decouple the shared clock-enabled supply node from the power supply while the clock signal is at the second level, wherein the shared clock-enabled supply node is coupled to a second latch circuit.

* * * * *

UNITED STATES PATENT AND TRADEMARK OFFICE
CERTIFICATE OF CORRECTION

| | |
|---|---|
| PATENT NO. | : 9,667,230 B1 |
| APPLICATION NO. | : 15/078956 |
| DATED | : May 30, 2017 |
| INVENTOR(S) | : Matthew Rudolph Fojtik et al. |

It is certified that error appears in the above-identified patent and that said Letters Patent is hereby corrected as shown below:

In the Specification

At Column 1, Line number 4, please add the following sentence:
--This invention was made with US Government support under Agreement HR0011-13-3-0001 awarded by DARPA. The US Government has certain rights in this invention.--

Signed and Sealed this
Fourteenth Day of July, 2020

Andrei Iancu
*Director of the United States Patent and Trademark Office*